(12) United States Patent
Mehandru et al.

(10) Patent No.: US 11,264,501 B2
(45) Date of Patent: Mar. 1, 2022

(54) DEVICE, METHOD AND SYSTEM FOR PROMOTING CHANNEL STRESS IN A NMOS TRANSISTOR

(71) Applicant: INTEL CORPORATION, Santa Clara, CA (US)

(72) Inventors: Rishabh Mehandru, Portland, OR (US); Anand Murthy, Portland, OR (US); Karthik Jambunathan, Hillsboro, OR (US); Cory Bomberger, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/637,213

(22) PCT Filed: Sep. 29, 2017

(86) PCT No.: PCT/US2017/054598
§ 371 (c)(1),
(2) Date: Feb. 6, 2020

(87) PCT Pub. No.: WO2019/066965
PCT Pub. Date: Apr. 4, 2019

(65) Prior Publication Data
US 2020/0227558 A1 Jul. 16, 2020

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02532* (2013.01); *H01L 21/823418* (2013.01);
(Continued)

(58) Field of Classification Search
CPC ..... H01L 21/823431; H01L 21/823821; H01L 21/845; H01L 29/66795–66818;
(Continued)

(56) References Cited

U.S. PATENT DOCUMENTS 7,947,546 B2 * 5/2011 Liu ................. H01L 21/823807
438/197
9,449,885 B1 * 9/2016 Reznicek ............. H01L 29/161
(Continued)

FOREIGN PATENT DOCUMENTS

KR         101264113        5/2013
WO     WO-2018063166 A1 *  4/2018  ....... H01L 29/66628

OTHER PUBLICATIONS

International Preliminary Report on Patentability from PCT/US2017/054598 dated Apr. 9, 2020, 10 pgs.
(Continued)

*Primary Examiner* — Sonya McCall-Shepard
(74) *Attorney, Agent, or Firm* — Essential Patents Group, LLP

(57) ABSTRACT

Techniques and mechanisms for imposing stress on a channel region of an NMOS transistor. In an embodiment, a fin structure on a semiconductor substrate includes two source or drain regions of the transistor, wherein a channel region of the transistor is located between the source or drain regions. At least on such source or drain region includes a doped silicon germanium (SiGe) compound, wherein dislocations in the SiGe compound result in the at least one source or drain region exerting a tensile stress on the channel region. In another embodiment, source or drain regions of a transistor each include a SiGe compound which comprises at least 50 wt % germanium.

16 Claims, 6 Drawing Sheets

(51) Int. Cl.
  *H01L 21/8234* (2006.01)
  *H01L 27/088* (2006.01)
  *H01L 29/08* (2006.01)
  *H01L 29/161* (2006.01)
  *H01L 21/8238* (2006.01)

(52) U.S. Cl.
  CPC .. *H01L 21/823431* (2013.01); *H01L 27/0886* (2013.01); *H01L 29/0847* (2013.01); *H01L 29/161* (2013.01)

(58) Field of Classification Search
  CPC ..... H01L 29/41791; H01L 29/785–786; H01L 2029/7857–7858; H01L 27/0886; H01L 27/0924; H01L 27/10826; H01L 27/10879; H01L 27/1211; H01L 29/7848; H01L 21/02532; H01L 21/823418; H01L 21/823412; H01L 29/0843; H01L 29/7843; H01L 29/1054; H01L 29/66636–66643; H01L 29/7842–7849
  See application file for complete search history.

(56) References Cited

U.S. PATENT DOCUMENTS

| | | |
|---|---|---|
| 2009/0020820 A1 | 1/2009 | Baik et al. |
| 2013/0009216 A1* | 1/2013 | Tsai ................. H01L 21/26506 257/288 |
| 2014/0008730 A1* | 1/2014 | Mitard ............ H01L 21/823807 257/369 |
| 2015/0270342 A1* | 9/2015 | Tsai ................. H01L 21/02529 257/43 |
| 2016/0204256 A1 | 7/2016 | Jackson et al. |
| 2016/0218042 A1 | 7/2016 | Ching et al. |
| 2016/0308049 A1* | 10/2016 | Tsai ................. H01L 29/66795 |
| 2017/0084746 A1 | 3/2017 | Lee et al. |
| 2017/0141226 A1 | 5/2017 | Jacob |
| 2019/0067456 A1* | 2/2019 | Wong ................ H01L 21/02535 |

OTHER PUBLICATIONS

International Search Report and Written Opinion for International Patent Application No. PCT/US17/54598, dated Jun. 29, 2018.

\* cited by examiner

DEVICE, METHOD AND SYSTEM FOR PROMOTING CHANNEL STRESS IN A NMOS TRANSISTOR

CLAIM OF PRIORITY

This Application is a National Stage Entry of, and claims priority to, PCT Application No. PCT/US17/54598, filed on 29 Sep. 2017 and titled "DEVICE, METHOD AND SYSTEM FOR PROMOTING CHANNEL STRESS IN A NMOS TRANSISTOR", which is incorporated by reference in its entirety for all purposes.

BACKGROUND

1. Technical Field

Embodiments of the invention relate generally to semiconductor technology and more particularly, but not exclusively, to stressed transistors.

2. Background Art

In semiconductor processing, transistors are typically formed on semiconductor wafers. In CMOS (complimentary metal oxide semiconductor) technology, transistors usually belong to one of two types: NMOS (negative channel metal oxide semiconductor) or PMOS (positive channel metal oxide semiconductor) transistors. The transistors and other devices may be interconnected to form integrated circuits (ICs) which perform numerous useful functions.

Operation of such ICs depends at least in part on the performance of the transistors, which in turn can be improved by an imposition of stress in channel regions. Specifically, performance of a NMOS transistor is improved by providing a tensile stress in its channel region, and performance of a PMOS transistor is improved by providing a compressive stress in its channel region.

A FinFET is a transistor built around a thin strip of semiconductor material (generally referred to as the fin). The transistor includes the standard field effect transistor (FET) nodes, including a gate, a gate dielectric, a source region, and a drain region. The conductive channel of such a device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a trigate FinFET. Other types of FinFET configurations are also available, such as so-called double-gate FinFETs, in which the conductive channel principally resides only along the two sidewalls of the fin (and not along the top of the fin). There are a number of non-trivial issues associated with fabricating such fin-based transistors.

BRIEF DESCRIPTION OF THE DRAWINGS

The various embodiments of the present invention are illustrated by way of example, and not by way of limitation, in the figures of the accompanying drawings and in which.

DETAILED DESCRIPTION

In various embodiments, apparatuses and methods relating to stressed transistors are described. Briefly, some embodiments variously promote channel stress to enhance the performance of one or more NMOS transistors. However, various embodiments may be practiced without one or more of the specific details, or with other methods, materials, or components. In other instances, well-known structures, materials, or operations are not shown or described in detail to avoid obscuring aspects of various embodiments. Similarly, for purposes of explanation, specific numbers, materials, and configurations are set forth in order to provide a thorough understanding of some embodiments. Nevertheless, some embodiments may be practiced without specific details. Furthermore, it is understood that the various embodiments shown in the figures are illustrative representations and are not necessarily drawn to scale.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, embodiments may be employed in any of a variety of electronic devices including one or more transistors including structures formed according to techniques described herein.

Figure 1:
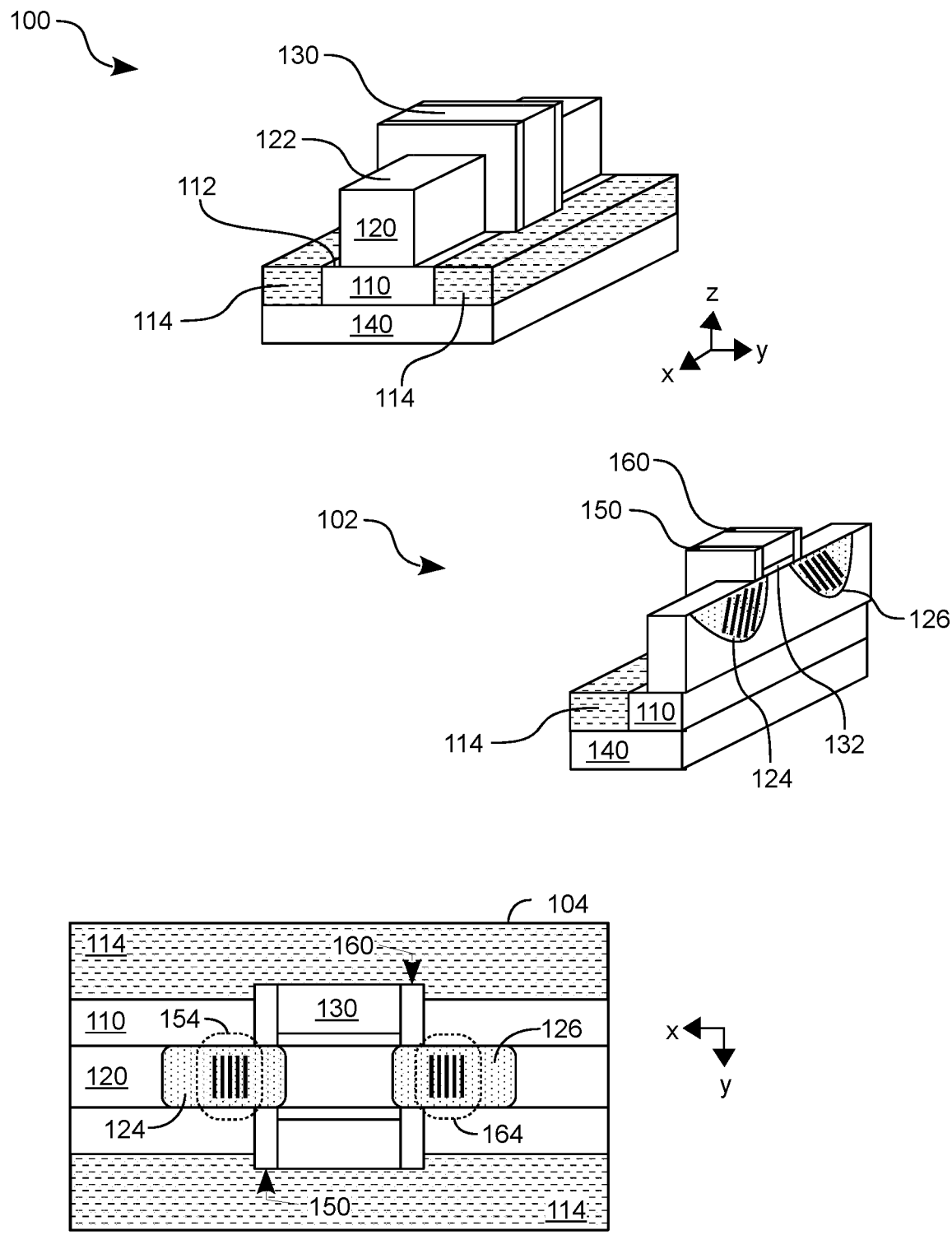
FIG. 1 shows various views illustrating elements of an integrated circuit to promote transistor stress according to an embodiment.

FIG. 1 shows in perspective view an integrated circuit (IC) device 100 including structures to impose stress on an NMOS transistor according to an embodiment. FIG. 1 also shows a cut-away perspective view 102 and a top plan view 104 of IC device 100.

IC device 100 is one example of an embodiment wherein an NMOS transistor includes a source region, or a drain region, which comprises a doped silicon germanium (SiGe) compound. Such an NMOS transistor may include doped source or drain regions of a fin structure, as well as gate structures—e.g., including a gate dielectric and a gate electrode—which extend over the fin structure. The fin structure may be formed by a first semiconductor body which is disposed on a second semiconductor body (referred to herein as a "buffer layer") that is to facilitate an imposition of a tensile stress on the NMOS transistor. For at least one source or drain region of the NMOS transistor, dislocations of the source or drain region may result a tensile stress being imposed on an adjoining channel region of the NMOS transistor.

In the example embodiment shown, IC device 100 includes a buffer layer 110 having a side 112. Buffer layer 110 may comprise one or more epitaxial single crystalline semiconductor layers (e.g., silicon, germanium, silicon germanium, gallium arsenide, indium phosphide, indium gallium arsenide, aluminum gallium arsenide, etc.) which—for example—may be grown atop a different bulk semiconductor substrate (such as the illustrative silicon substrate 140 shown).

Although some embodiments are not limited in this regard, buffer layer 110 may comprise various epitaxially grown semiconductor sub-layers having different lattice constants. Such semiconductor sub-layers may serve to grade the lattice constant along the z-axis of the xyz coordinate system shown. For example, a germanium concentration of the SiGe buffer layers 110 may increase from 30% germanium at the bottom-most buffer layer to 70% germanium at the top-most buffer layer, thereby gradually increasing the lattice constant.

IC device 100 may further include on buffer layer 110 a first semiconductor body which forms a fin structure (such as the illustrative fin structure 120 shown). For example, the first semiconductor body may be formed in part from an epitaxially grown single crystalline semiconductor such as, but not limited to Si, Ge, GeSn, SiGe, GaAs, InSb, GaP, GaSb, InAlAs, InGaAs, GaSbP, GaAsSb, GaN, GaP, and InP. Fin structure 120 may extend to side 112, in some embodiments. In other embodiments, the first semiconductor body may further comprise an underlying sublayer portion from which fin structure 120 extends (e.g., where the underlying sublayer portion is disposed between, and adjoins each of, side 112 and fin structure 120).

As used herein, "source or drain region" (or alternatively, "source/drain region") refers to a structure which is configured to function as one of a source of a transistor or a drain of a transistor. Doped portions of fin structure 120 may provide a source of an NMOS transistor and a drain of the NMOS transistor (such as the illustrative source/drain regions 124, 126 shown). A channel region of the NMOS transistor may be disposed between source/drain regions 124, 126, wherein a gate dielectric 132 and a gate electrode 130 variously extend over a portion of fin structure 120 which includes the channel region. For example, source/drain regions 124, 126 regions may extend under laterally opposite sides of gate electrode 130.

Source/drain regions 124, 126 and the channel region may be configured to conduct current during operation of IC device 100—e.g., the current controlled using gate electrode 130. For example, source/drain regions 124, 126 may be disposed in a source/drain well which is formed with fin structure 120. One or both of source/drain regions 124, 126 may comprise a SiGe compound—e.g., wherein other portions of fin structure 120 have a different compound than the SiGe compound. Source/drain regions 124, 126 may include any of a variety of suitable n-type dopants, such as one of phosphorus or arsenic.

Structures of buffer layer 110 and/or structures of fin structure 120 may be electrically isolated at least in part, by insulation structures 114 (for example), from other circuit structures of IC device 100. Insulation structures 114 may include silicon dioxide or any of a variety of other dielectric materials adapted, for example, from conventional isolation techniques. The sizes, shapes, number and relative configuration of insulation structures 114 are merely illustrative, and IC device 100 may include any of a variety of additional or alternative insulation structures, in other embodiments.

Gate dielectric 132 may include a high-k gate dielectric, such as hafnium oxide. In various other embodiments, gate dielectric 132 may include hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate. In another embodiment, gate dielectric 132 includes silicon dioxide.

Gate electrode 130 may be formed of any suitable gate electrode material. In an embodiment, gate electrode 130 comprises a doped polycrystalline silicon. Alternatively or in addition, gate electrode 130 may comprise a metal material, such as but not limited to tungsten, tantalum, titanium and their nitrides. It is to be appreciated that gate electrode 130 need not necessarily be a single material and may be a composite stack of thin films, such as but not limited to a polycrystalline silicon/metal electrode or a metal/polycrystalline silicon electrode.

Dielectric sidewall spacers 150, 160 may be formed at opposite sidewalls of the gate electrode 130—e.g., wherein spacers 150, 160 comprise silicon nitride, silicon oxide, silicon oxynitride or combinations thereof. The respective thickness of sidewall spacers 150, 160 may facilitate isolation of gate electrode 130 during processes to form source/drain regions 124, 126.

Although some embodiments are not limited in this regard, the NMOS transistor may include multiple distinct channel regions each between source/drain regions 124, 126—e.g., the multiple channel regions including one or more nanowire structures. Such one or more nanowires may, for example, be formed of any of various suitable materials such as, but not limited to Si, Ge, SiGe, GaAs, InSb, GaP, GaSb, InAlAs, InGaAs, GaSbP, GaAsSb, InP, and carbon nanotubes.

In an embodiment, the first semiconductor body which forms fin structure 120 may have a crystalline structure other than that of the adjoining buffer layer 110. A mismatch (e.g., the lattice constant mismatch) between fin structure 120 and side 112 may result in a tensile stress being imposed in a channel region which is between source/drain regions 124, 126. For example, a lattice constant of side 112 may be different from the lattice constant of fin structure 120. In one such embodiment, one of side 112 and fin structure 120 comprises silicon germanium having a first silicon-to-germanium component ratio, where the other of side 112 and fin structure 120 comprises pure silicon or silicon germanium having a second silicon-to-germanium component ratio other than the first silicon-to-germanium component ratio. However, any of various other lattice mismatches may be provided with 110 and fin structure 120, in different embodiments.

To facilitate the imposition of a tensile stress one of both of source drain regions 124, 126 may have respective dislocations formed therein. For example, source drain region 124 may include dislocations 154 and/or source drain region 126 may include dislocations 164. Some embodiments are based on a realization by the inventors that SiGe compounds, conventionally used to provide compressive stress in PMOS transistors, may alternatively impose a tensile stress with the further inclusion of dislocations therein.

Dislocations of some embodiments (such as dislocations 154, 164) are variously represented in the figures of the present disclosure with thick lines, as in views 102, 104. However, such lines are merely symbolic, and are not necessarily limiting on the number, size, direction and/or shape of dislocations in a source-drain region. For example, dislocations 154 and/or dislocations 164 may variously extend each along a respective one of a y-axis direction, an x-axis direction or any of various other directions. Multiple dislocations within a single source-drain region may variously extend along different respective directions, in some embodiments. Alternatively or in addition, a given dislocation may form one or more angled regions (e.g., where such a dislocation follows a zigzag path within a source-drain region). In some embodiments, one or more dislocations may each appear, in a given cross-sectional plane, as a point dislocation.

Figure 2:
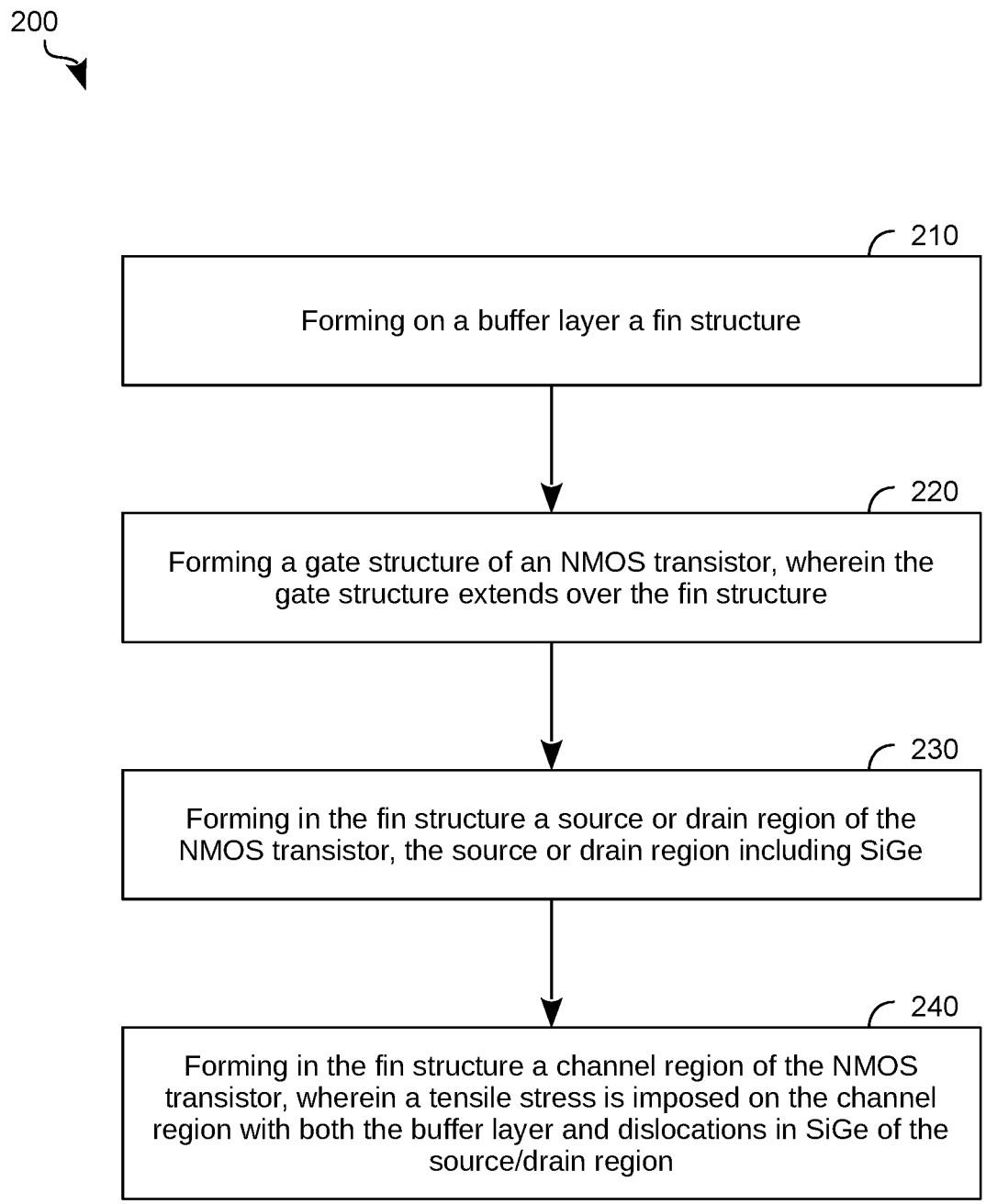
FIG. 2 is a flow diagram illustrating elements of a method for promoting stress in a channel of a transistor according to an embodiment.

FIG. 2 shows features of a method 200 to provide stress on structures of a transistor according to an embodiment. Method 200 may include processes to fabricate some or all of the structure of IC device 100, for example. To illustrate certain features of various embodiments, method 200 is described herein with reference to structures shown in FIGS. 3A, 3B. However, any of a variety of additional or alternative structures may be fabricated according to method 200, in different embodiments.

Figure 3A:
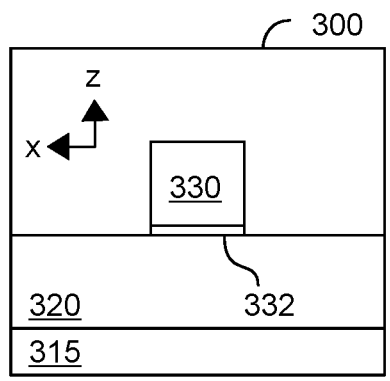
FIGS. 3A, 3B show cross-sectional views each illustrating structures at a respective stage of semiconductor fabrication processing according to an embodiment.
Figure 3A:
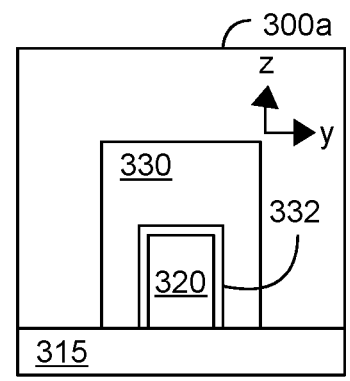
Figure 3A:
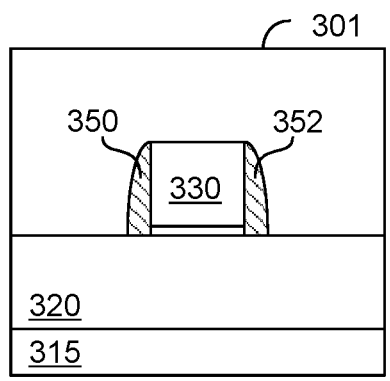
Figure 3A:
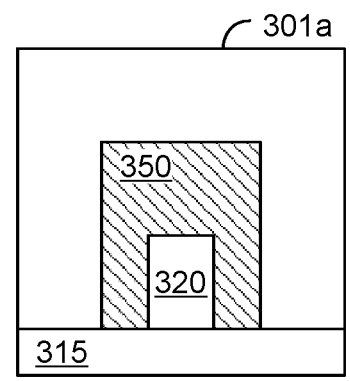
Figure 3A:
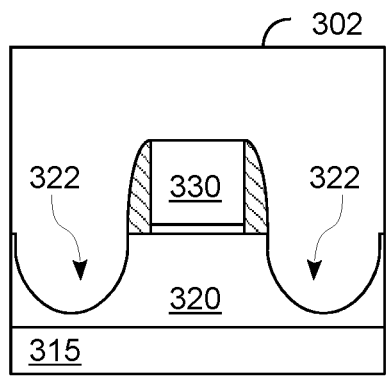
Figure 3A:
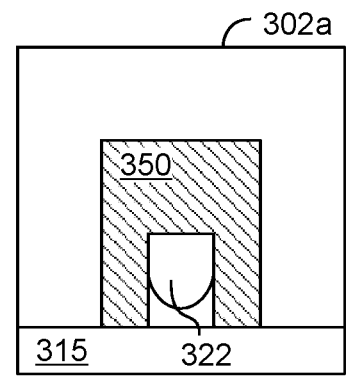
Figure 3B:
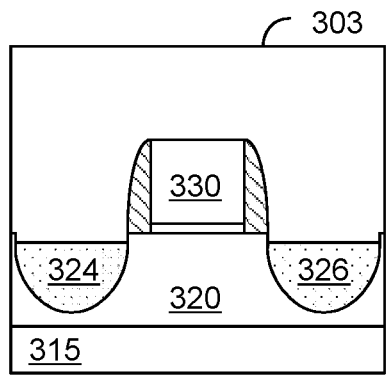
Figure 3B:
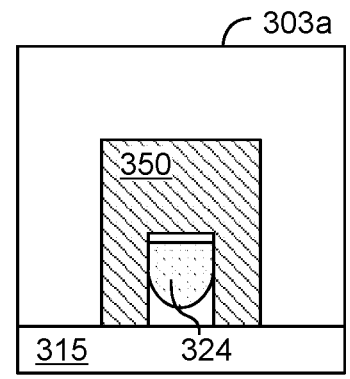
Figure 3B:
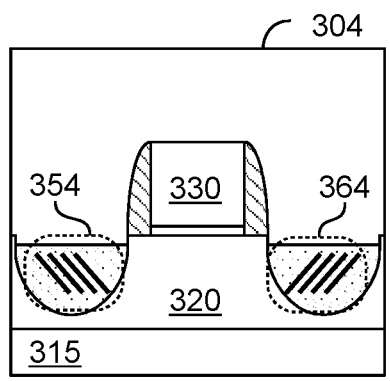
Figure 3B:
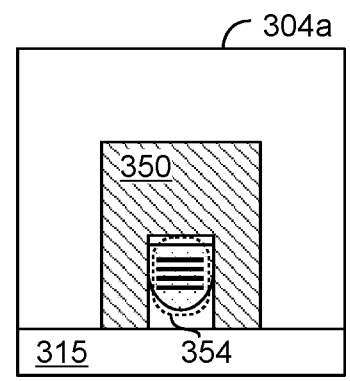
Figure 3B:
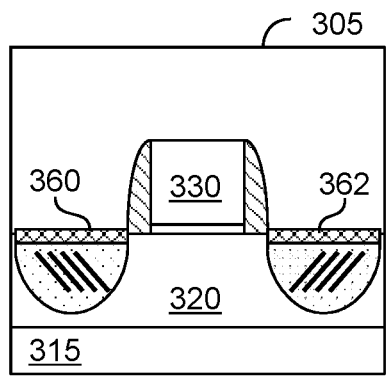
Figure 3B:
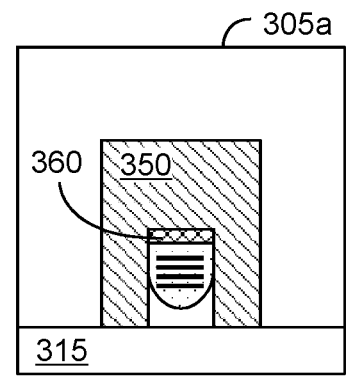

Method 200 may include, at 210, forming on a buffer layer a fin structure and, at 220, forming a gate structure of an NMOS transistor, wherein the gate structure extends over the fin structure. For example, referring now to FIGS. 3A, 3B, cross-sectional side views are shown for respective stages 300-305 of processing to fabricate transistor structures according to an embodiment. FIGS. 3A, 3B also show cross-sectional end views 300a-305a corresponding to stages 300-305, respectively. As shown at stage 300, a fin structure 320 may be disposed directly or indirectly on a buffer layer 315—e.g., where fin structure 320 and buffer layer 315 correspond functionally to fin structure 120 and buffer layer 110, respectively. A gate dielectric 332 and a gate electrode 330 may be selectively formed, in sequence, each to extend at least partially around fin structure 320. Fin structure 320, gate dielectric 332, gate electrode 330 and/or other structures may, for example, be formed during stages 300-305 using operations adapted from conventional semiconductor fabrication techniques—e.g., including mask, lithography, deposition (e.g., chemical vapor deposition), etching and/or other processes. Some of these conventional techniques are not detailed herein to avoid obscuring certain features of various embodiments.

As shown at stage 301, one or more spacer portions (such as the illustrative spacer portions 350, 352 shown) may be formed—e.g., each at a respective one of two opposite sidewalls of gate electrode 330. Spacers 350, 352 may be formed by blanket depositing a conformal dielectric film, such as, but not limited to, silicon nitride, silicon oxide, silicon oxynitride or combinations thereof. A dielectric material of spacers 350, 352 may be deposited in a conformal manner so that the dielectric film forms to substantially equal heights on vertical surfaces, such as the sidewalls of gate electrode 330. In one exemplary embodiment, the dielectric film is a silicon nitride film formed by a hot-wall low-pressure chemical vapor deposition (LPCVD) process. The deposited thickness of the dielectric film may determine the width or thickness of the formed spacers 350, 352. In an embodiment, the thickness of one of spacer portions 350, 352 may facilitate isolation of gate electrode 330 during subsequent processes to form one or more doped source/drain regions. For example, such a dielectric film may be formed to a thickness (x-axis dimension) in a range of 4 to 15 nm—e.g., wherein the thickness is in a range of 4 nm to 8 nm.

In an embodiment, method 200 further comprises, at 230, forming in the fin structure a source/drain region of the NMOS transistor, the source/drain region including silicon-germanium (SiGe). Method 200 may further comprise, at 240, forming in the fin structure a channel region of the NMOS transistor, wherein a tensile stress is imposed on the channel region with both the buffer layer and dislocations in SiGe of the source/drain region.

Subsequent to the formation of spacer portions 350, 352, one or more recess structures may be etched or otherwise formed in fin structure 320. For example, as shown at stage 302, a wet etch and/or other subtractive processing may be performed—e.g., through a patterned mask (not shown)—to remove portions of fin structure 320, resulting in formation of one or both of the illustrative recesses 322 shown. One or each of recesses 322 may allow for the subsequent deposition therein of a SiGe material which is to provide at least part of a source/drain region.

For example, as shown at stage 303, a SiGe compound may be epitaxially grown—e.g., by chemical vapor deposition (CVD) or other such additive processes at 230 of method 200—to form one or both of the illustrative SiGe bodies 324, 326 shown. The SiGe compound may include a dopant during deposition thereof or, alternatively, may be subsequently doped after formation of SiGe bodies 324, 326 using ion implantation, plasma implantation or other such doping processes.

During or after epitaxial growth and/or doping thereof, SiGe bodies 324, 326 may have dislocations formed therein. For example, as shown at stage 304, dislocations 354 may form in SiGe body 324 and/or dislocations 364 may form in SiGe body 326. A total number of dislocations 354 (and/or a total number of dislocations 364) may be due at least in part to a relatively high component ratio of germanium in SiGe bodies 324, 326. For example, one or each of SiGe bodies 324, 326 may comprise at least 50 wt % germanium and, in some embodiments, 60 wt % or more germanium.

The total number of the dislocations 354 may result in SiGe body 324 imposing a tensile stress—e.g., rather than a compressive stress—on a channel region which is between SiGe bodies 324, 326. Alternatively or in addition, the total number of the dislocations 364 may similarly result in SiGe body 326 imposing a tensile stress on such a channel region. In one example embodiment, a gate structure of the transistor (e.g., including one or both of gate electrode 330 and gate dielectric 332) may extend across a length (x-axis dimension) of fin structure 320. In such an embodiment, an extent of the source/drain region along the length of fin structure 320 may be between 5 nanometers (nm) and 100 nm, wherein a total number of the dislocations in the SiGe of the source/drain region is at least 4—e.g., in a range of 4 to 10, inclusive. However, a source/drain region may exert tensile stress due to more or fewer dislocations—e.g., depending on dimensions and composition of the source/drain region.

In some embodiments, method 200 may further comprise forming a doped silicon cap on the source/drain region. For example, as shown at stage 305, doped silicon caps 360, 362 may be formed over SiGe bodies 324, 326, respectively. Without presence of such a silicon cap, the transistor may otherwise have a high Schottky contact resistance that, for example, could impact overall device current and switching performance. One or more insulation structures (not shown)—e.g., including insulation structures 114—may be formed during or after stages 300-305, in some embodiments.

As with a transistor such as that formed from the processing shown by stages 300-305, multiple transistors of an IC device (e.g., an IC die) may be fabricated according to method 200. For example, method 200 may further comprise forming structures of a second NMOS transistor (e.g., a second source/drain region and a second channel region) in the fin structure. In such an embodiment, the second NMOS transistor may have one or more of the stress-inducing features described herein—e.g., wherein the second source/drain region similarly comprises a SiGe compound which imposes a tensile stress on the adjoining second channel region. Alternatively or in addition, method 200 may further comprise forming a second fin structure on the buffer layer, and forming structures of another NMOS transistor (e.g., another source/drain region and another channel region) in the second fin structure. In such an embodiment, this other NMOS transistor may have one or more of the stress-inducing features described herein—e.g., wherein the other source/drain region similarly comprises a SiGe compound which imposes a tensile stress on an adjoining channel region.

Figure 4:
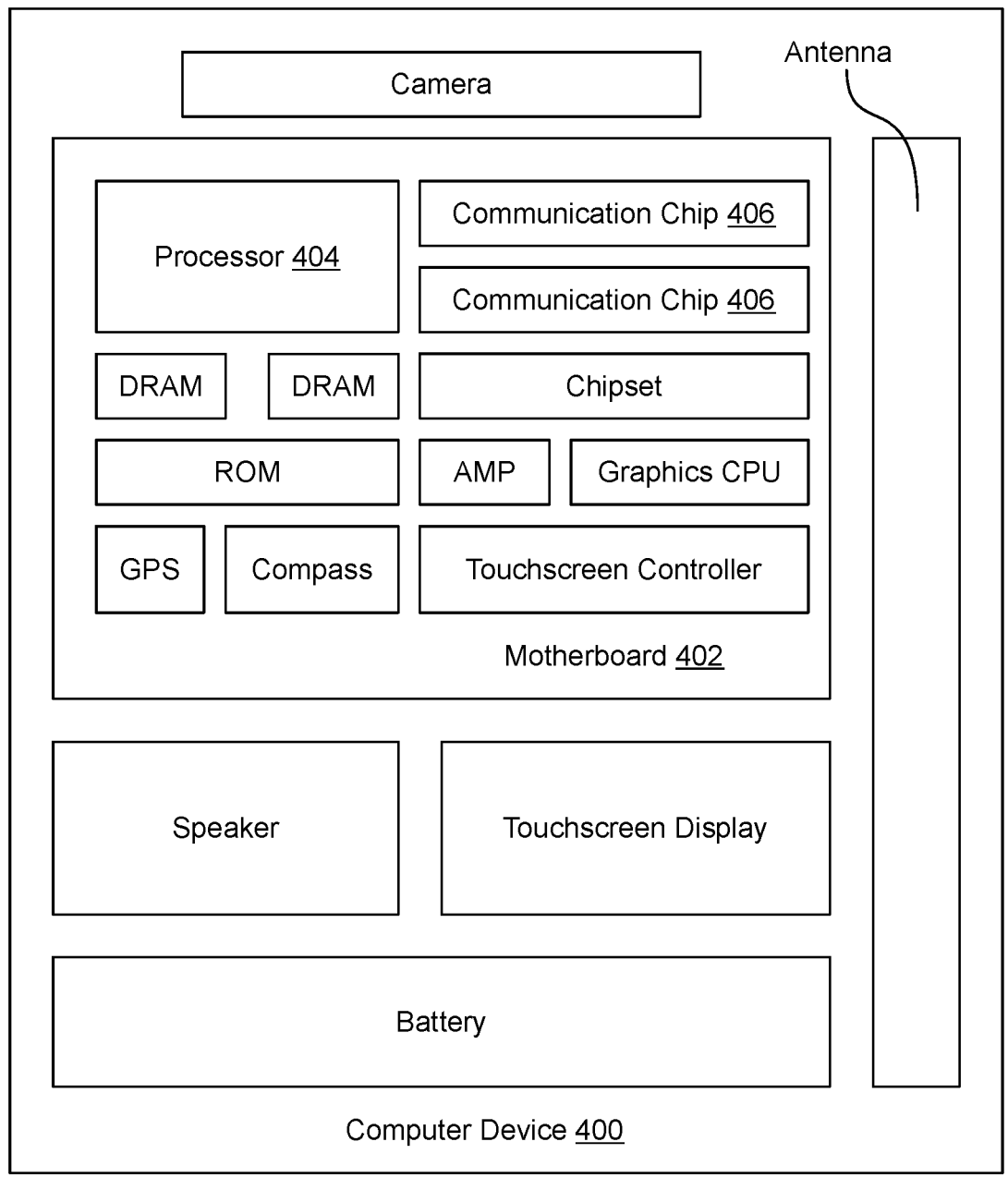
FIG. 4 is a functional block diagram illustrating a computing device in accordance with one embodiment.

FIG. 4 illustrates a computing device 400 in accordance with one embodiment. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. The term "processor" may refer to any device or portion of a device that processes electronic data from registers and/or memory to transform that electronic data into other electronic data that may be stored in registers and/or memory. The communication chip 406 also includes an integrated circuit die packaged within the communication chip 406.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 5:
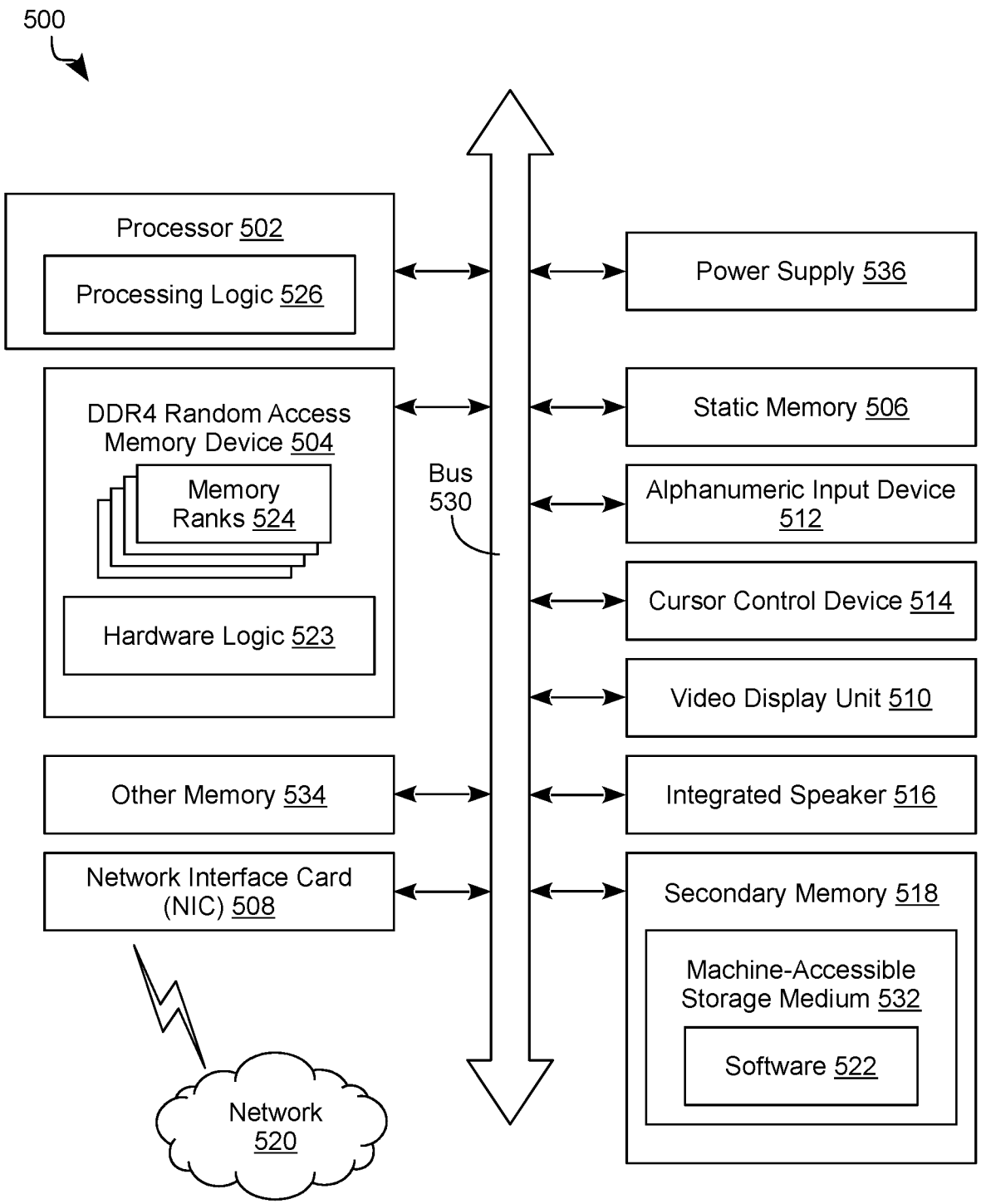
FIG. 5 is a functional block diagram illustrating an exemplary computer system, in accordance with one embodiment.

FIG. 5 illustrates a diagrammatic representation of a machine in the exemplary form of a computer system 500 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations described herein.

The computer system 500 may further include a network interface device 508. The computer system 500 also may include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 532 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, an integrated circuit (IC) device comprises a buffer layer and a fin structure disposed on the buffer layer, the fin structure including a source or drain region of a NMOS transistor, and a channel region of the NMOS transistor, the channel region adjacent to the source or drain region, wherein a tensile stress is imposed on the channel region with both the buffer layer and dislocations in silicon-germanium (SiGe) of the source or drain region. The IC device further comprises a gate structure of the NMOS transistor, wherein the gate structure extends over the fin structure.

In an embodiment, the IC device further comprises a silicon cap disposed on the source or drain region. In another embodiment, the gate structure extends across a length of the fin structure, wherein an extent of the source or drain region along the length of the fin structure is between 5 nanometers (nm) and 100 nm, and wherein a total number of the dislocations in the SiGe of the source or drain region is in a range of 4 to 10, inclusive. In another embodiment, the SiGe of the source or drain region includes at least 50% germanium. In another embodiment, the SiGe of the source or drain region includes at least 60% germanium. In another embodiment, the fin structure further includes a second source or drain region of a second NMOS transistor, and a second channel region of the second NMOS transistor, the second channel region adjacent to the second source or drain region, wherein a tensile stress is imposed on the second channel region with both the buffer layer and dislocations in SiGe of the second source or drain region. In another embodiment, the IC device further comprises a second fin structure including a second source or drain region of a second NMOS transistor and a second channel region of the second NMOS transistor, the second channel region adjacent to the second source or drain region, wherein a tensile stress is imposed on the second channel region with both the buffer layer and dislocations in SiGe of the second source or drain region. The IC device further comprises a second gate structure of the second NMOS transistor, wherein the second gate structure extends over the fin structure. In another embodiment, the fin structure further includes a third source or drain region of a third NMOS transistor, and a third channel region of the third NMOS transistor, the third channel region adjacent to the third source or drain region, wherein a tensile stress is imposed on the third channel region with both the buffer layer and dislocations in SiGe of the third source or drain region.

In another implementation, a method comprises forming on the buffer layer a fin structure including silicon-germanium (SiGe) and forming in the fin structure a source or drain region of a NMOS transistor, and a channel region of the NMOS transistor, the channel region adjacent to the source or drain region, wherein a tensile stress is imposed on the channel region with both the buffer layer and dislocations in SiGe of the source or drain region. The method further comprises forming a gate structure of the NMOS transistor, wherein the gate structure extends over the fin structure.

In an embodiment, the method further comprises forming a silicon cap on the source or drain region. In another embodiment, the gate structure extends across a length of the fin structure, wherein an extent of the source or drain region along the length of the fin structure is between 5 nanometers (nm) and 100 nm, and wherein a total number of the dislocations in the SiGe of the source or drain region is in a range of 4 to 10, inclusive. In another embodiment, the SiGe of the source or drain region includes at least 50% germanium. In another embodiment, the SiGe of the source or drain region includes at least 60% germanium. In another embodiment, the method further comprises forming in the fin structure a second source or drain region of a second NMOS transistor, and a second channel region of the second NMOS transistor, the second channel region adjacent to the second source or drain region, wherein a tensile stress is imposed on the second channel region with both the buffer layer and dislocations in SiGe of the second source or drain region. In another embodiment, the method further comprises forming on the buffer layer a second fin structure including SiGe and forming in the second fin structure a second source or drain region of a second NMOS transistor, and a second channel region of the second NMOS transistor, the second channel region adjacent to the second source or drain region, wherein a tensile stress is imposed on the second channel region with both the buffer layer and dislocations in SiGe of the second source or drain region. In another embodiment, the method further comprises forming in the fin structure a third source or drain region of a third NMOS transistor, and a third channel region of the third NMOS transistor, the third channel region adjacent to the third source or drain region, wherein a tensile stress is imposed on the third channel region with both the buffer layer and dislocations in SiGe of the third source or drain region, and forming a third gate structure of the third NMOS transistor, wherein the third gate structure extends over the fin structure.

In another implementation, a system comprises an integrated circuit (IC) device comprising a buffer layer, a fin structure disposed on the buffer layer, the fin structure including a source or drain region of a NMOS transistor, and a channel region of the NMOS transistor, the channel region adjacent to the source or drain region, wherein a tensile stress is imposed on the channel region with both the buffer layer and dislocations in silicon-germanium (SiGe) of the source or drain region. The IC device further comprises a gate structure of the NMOS transistor, wherein the gate structure extends over the fin structure. The system further comprises a display device coupled to the IC device, the display device to display an image based on a signal communicated with the IC device.

In an embodiment, the IC device further comprises a silicon cap disposed on the source or drain region. In another embodiment, the gate structure extends across a length of the fin structure, wherein an extent of the source or drain region along the length of the fin structure is between 5 nanometers (nm) and 100 nm, and wherein a total number of the dislocations in the SiGe of the source or drain region is in a range of 4 to 10, inclusive. In another embodiment, the SiGe of the source or drain region includes at least 50% germanium. In another embodiment, the SiGe of the source or drain region includes at least 60% germanium. In another embodiment, the fin structure further includes a second source or drain region of a second NMOS transistor, and a second channel region of the second NMOS transistor, the second channel region adjacent to the second source or drain region, wherein a tensile stress is imposed on the second channel region with both the buffer layer and dislocations in SiGe of the second source or drain region. In another embodiment, the IC device further comprises a second fin structure including a second source or drain region of a second NMOS transistor, and a second channel region of the second NMOS transistor, the second channel region adjacent to the second source or drain region, wherein a tensile stress is imposed on the second channel region with both the buffer layer and dislocations in SiGe of the second source or drain region. The IC device further comprises a second gate structure of the second NMOS transistor, wherein the second gate structure extends over the fin structure. In another embodiment, the fin structure further includes a third source or drain region of a third NMOS transistor, and a third channel region of the third NMOS transistor, the third channel region adjacent to the third source or drain region, wherein a tensile stress is imposed on the third channel region with both the buffer layer and dislocations in SiGe of the third source or drain region.

Techniques and architectures for promoting stress in a transistor are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) device comprising:
a first body of a first semiconductor material, the first body on a substrate of a second semiconductor material other than the first semiconductor material;
a fin structure disposed on the first body, the fin structure comprising:
a first source or drain region of a first NMOS transistor; and
a first channel region of the first NMOS transistor, the first channel region adjacent to the first source or drain region, wherein a tensile stress is imposed on the first channel region with both the first body and dislocations in silicon-germanium (SiGe) of the first source or drain region;
a second source/drain region of a second NMOS transistor; and
a second channel region of the second NMOS transistor, the second channel region adjacent to the second source/drain region, wherein a tensile stress is imposed on the second channel region with both the first body and dislocations in SiGe of the second source/drain region;
a gate structure of the first NMOS transistor, wherein the gate structure extends over the fin structure;
wherein the gate structure extends across a length of the fin structure, wherein an extent of the first source or drain region along the length of the fin structure is between 5 nanometers (nm) and 100 nm, and wherein a total number of the dislocations in the SiGe of the first source or drain region is in a range of 4 to 10, inclusive.

2. The IC device of claim 1, further comprising a silicon cap disposed on the first source or drain region.

3. The IC device of claim 1, wherein the SiGe of the first source or drain region comprises at least 50% germanium.

4. The IC device of claim 3, wherein the SiGe of the first source or drain region comprises at least 60% germanium.

5. The IC device of claim 1, further comprising:
a second fin structure comprising:
a third source/drain region of a third NMOS transistor; and
a third channel region of the third NMOS transistor, the third channel region adjacent to the third source/drain region, wherein a tensile stress is imposed on the third channel region with both the first body and dislocations in SiGe of the third source/drain region; and
a third gate structure of the third NMOS transistor, wherein the third gate structure extends over the second fin structure.

6. The IC device of claim 1, the fin structure further comprising:
a third source/drain region of a third NMOS transistor; and
a third channel region of the third NMOS transistor, the third channel region adjacent to the third source/drain region, wherein a tensile stress is imposed on the third channel region with both the first body and dislocations in silicon-germanium (SiGe) of the third source/drain region.

7. A method comprising:
forming a fin structure on a first body of a first semiconductor material, wherein the first body is on a substrate of a second semiconductor material other than the first semiconductor material, the fin structure comprising silicon-germanium (SiGe);
forming in the fin structure:
a first source or drain region of a first NMOS transistor; and
a first channel region of the first NMOS transistor, the first channel region adjacent to the first source or drain region, wherein a tensile stress is imposed on the first channel region with both the first body and dislocations in SiGe of the first source or drain region;
a second source/drain region of a second NMOS transistor; and
a second channel region of the second NMOS transistor, the second channel region adjacent to the second source/drain region, wherein a tensile stress is imposed on the second channel region with both the first body and dislocations in SiGe of the second source/drain region;
forming a gate structure of the first NMOS transistor, wherein the gate structure extends over the fin structure;
wherein the gate structure extends across a length of the fin structure, wherein an extent of the first source or drain region along the length of the fin structure is between 5 nanometers (nm) and 100 nm, and wherein a total number of the dislocations in the SiGe of the first source or drain region is in a range of 4 to 10, inclusive.

8. The method of claim 7, further comprising forming a silicon cap on the first source or drain region.

9. The method of claim 7, wherein the SiGe of the first source or drain region comprises at least 50% germanium.

10. The method of claim 9, wherein the SiGe of the first source or drain region comprises at least 60% germanium.

11. The method of claim 7, further comprising:
forming on the first body a third fin structure comprising SiGe;
forming in the third fin structure:
a third source/drain region of a third NMOS transistor; and
a third channel region of the third NMOS transistor, the third channel region adjacent to the third source/drain region, wherein a tensile stress is imposed on the third channel region with both the first body and dislocations in SiGe of the third source/drain region.

12. The method of claim 7, further comprising:
forming in the fin structure:
a third source/drain region of a third NMOS transistor; and
a third channel region of the third NMOS transistor, the third channel region adjacent to the third source/drain region, wherein a tensile stress is imposed on the third channel region with both the first body and dislocations in SiGe of the third source/drain region; and
forming a third gate structure of the third NMOS transistor, wherein the third gate structure extends over the fin structure.

13. A system comprising:
an integrated circuit (IC) device comprising:
a first body of a first semiconductor material, the first body on a substrate of a second semiconductor material other than the first semiconductor material;
a fin structure disposed on the first body, the fin structure comprising:
a first source or drain region of a first NMOS transistor; and
a first channel region of the first NMOS transistor, the first channel region adjacent to the first source or drain region, wherein a tensile stress is imposed on the first channel region with both the first body and dislocations in silicon-germanium (SiGe) of the first source or drain region;
a second source/drain region of a second NMOS transistor; and
a second channel region of the second NMOS transistor, the second channel region adjacent to the second source/drain region, wherein a tensile stress is imposed on the second channel region with both the first body and dislocations in SiGe of the second source/drain region;
a gate structure of the first NMOS transistor, wherein the gate structure extends over the fin structure;
wherein the gate structure extends across a length of the fin structure, wherein an extent of the first source or drain region along the length of the fin structure is between 5 nanometers (nm) and 100 nm, and wherein a total number of the dislocations in the SiGe of the first source or drain region is in a range of 4 to 10, inclusive; and
a display device coupled to the IC device, the display device to display an image based on a signal communicated with the IC device.

14. The system of claim 13, the IC device further comprising a silicon cap disposed on the first source or drain region.

15. The system of claim 13, wherein the SiGe of the first source or drain region comprises at least 50% germanium.

16. The system of claim 15, wherein the SiGe of the first source or drain region comprises at least 60% germanium.

* * * * *